United States Patent
Enescu et al.

(10) Patent No.: US 12,009,831 B2
(45) Date of Patent: Jun. 11, 2024

(54) SYSTEM HAVING AN ANALOG TO DIGITAL CONVERTER (ADC) AND A DIGITAL SIGNAL PROCESSOR

(71) Applicant: NXP USA, Inc., Austin, TX (US)

(72) Inventors: Andrei Alexandru Enescu, Bucharest (RO); Wim Joseph Rouwet, Austin, TX (US)

(73) Assignee: NXP USA, Inc., Austin, TX (US)

( * ) Notice: Subject to any disclaimer, the term of this patent is extended or adjusted under 35 U.S.C. 154(b) by 172 days.

(21) Appl. No.: 17/649,450

(22) Filed: Jan. 31, 2022

(65) Prior Publication Data

US 2022/0385298 A1 Dec. 1, 2022

(30) Foreign Application Priority Data

May 28, 2021 (RO) ................. a 2021 00297

(51) Int. Cl.
*H04L 27/00* (2006.01)
*H03M 1/12* (2006.01)
*H04L 25/02* (2006.01)

(52) U.S. Cl.
CPC ........ *H03M 1/1245* (2013.01); *H04L 25/028* (2013.01)

(58) Field of Classification Search
CPC ............ H04B 1/1018; H04B 1/18; H04B 2001/0416; H03M 1/1285; H03M 1/1023; H03M 3/30; H03M 1/001; H04L 25/08; H04L 27/06; H04L 27/2653; H04N 5/455; H04N 21/42607
USPC .......................................... 375/295
See application file for complete search history.

(56) References Cited

U.S. PATENT DOCUMENTS

| | | | |
|---|---|---|---|
| 6,031,879 A | 2/2000 | Pace et al. | |
| 6,459,743 B1* | 10/2002 | Lipka | H04L 27/2332 375/329 |
| 9,742,448 B1* | 8/2017 | Sternowski | H04L 25/08 |
| 10,218,372 B1* | 2/2019 | Farley | H03M 1/0836 |
| 2009/0164160 A1* | 6/2009 | Gibson | G01R 23/02 702/75 |
| 2010/0138520 A1 | 6/2010 | Gallant | |

* cited by examiner

*Primary Examiner* — Khai Tran

(57) ABSTRACT

A system includes an ADC configured to generate a superposition signal by the ADC being configured to undersample an input signal at a sampling frequency in which the input signal that is input to the analog to digital converter has a bandwidth and the sampling frequency is less than a Nyquist rate for the bandwidth of the input signal. The system includes a digital signal processor (DSP) configured to digitally process the superposition signal to separate the superposition signal into a plurality of bitstreams, where each of the plurality of bitstreams corresponds to information in a different one of a plurality of separable, distinct frequency bands within the input signal. The information in the superposition signal for at least one of the said plurality of bitstreams is present in the input signal at frequencies greater than the sampling frequency, and the DSP is configured to output said plurality of bitstreams.

20 Claims, 4 Drawing Sheets

SYSTEM HAVING AN ANALOG TO DIGITAL CONVERTER (ADC) AND A DIGITAL SIGNAL PROCESSOR

CROSS-REFERENCE TO RELATED APPLICATIONS

This application claims the priority under 35 U.S.C. § 119 of Romania application no. A202100297, filed on 28 May 2021, the contents of which are incorporated by reference herein.

FIELD

The present disclosure relates to a system having an analog to digital converter (ADC) and a digital signal processer.

BACKGROUND

Wide band communication systems imply the use of high-end data converters, including ADCs, to sample the signal at twice the signal bandwidth (known as the Nyquist rate). Such ADCs are complex, power hungry and expensive.

BRIEF DESCRIPTION OF THE DRAWINGS

One or more embodiments will now be described by way of example only with reference to the accompanying drawings in which.

DETAILED DESCRIPTION

Figure 1:
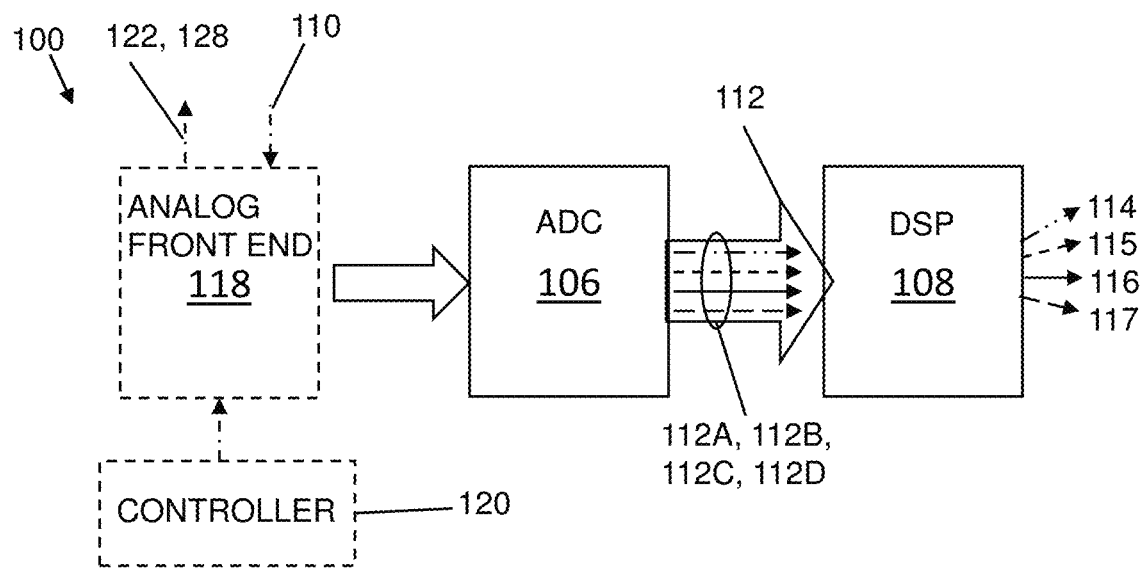
FIG. 1 shows a block diagram of an example embodiment of the apparatus having an ADC and digital signal processor and, in addition, shows an analog front end arrangement and a controller.

Many communication systems make use of very wide band signals to carry high information rates in higher frequency bands/spectrums. For example, the 5G telecommunication standard uses millimetre wave (mmWave) frequencies. The proposed 6G telecommunication standard may use frequencies in the Terahertz, THz, spectrum. The wide band nature of these communication systems implies the need for a high-end data converters, including an ADC to sample the signal at twice maximum frequency of interest in order to accurately sample the signal content. This is known as the Nyquist frequency. Such high frequency ADCs are complex and therefore power hungry and expensive.

As will be known to those skilled in the art of signal processing, the Nyquist rate is the sampling frequency required to correctly sample a signal, that is to capture the information carried by the signal. The Nyquist rate includes double the highest frequency component of that signal. If a signal is sampled at less than the Nyquist rate, aliasing occurs in the sampled signal. Thus, content in the signal that has frequencies above half the sampling rate will be "folded" and aliased in the sampled signal.

In particular, an ADC may be configured to sample a signal at a given sampling frequency (Fsample). Signal content at frequencies greater than 0.5×Fsample is undersampled and aliases back into the baseband. This aliasing creates a sampled signal that includes a "mix" or a "superposition" of both lower frequency content (the frequency content below 0.5×Fsample) and the aliased frequency content of the signal. The concept of aliasing in an under-sampled signal will be known to those skilled in the art and will not be described in more detailed here. To avoid aliasing, it is common for a signal to be filtered to remove frequency content above 0.5×Fsample.

The example embodiments disclosed herein provide an apparatus that includes an analog to digital converter (ADC) together with a digital signal processor (DSP). Embodiments of the proposed apparatus are configured to undersample a signal to create a so called superposition signal that includes a mix of both the frequency content below 0.5×Fsample and the aliased signal content and then to digitally process the undersampled signal. Embodiments of the apparatus may be configured to use orthogonal signal separation techniques to extract information from the superposition signal. The DSP may be configured to separate out information, that is bitstreams for example, contained in different frequency bands of a signal despite that signal being undersampled. The embodiments may make use of orthogonal encoding schemes for the different frequency bands within the signal and, in particular, for frequency bands that are undersampled. In one or more examples, the frequency bands are non-overlapping in frequency, and each occupies a discrete portion of the operational bandwidth of the input signal to the apparatus. Thus, in one or more examples, it has been found that despite the under-sampling, orthogonality between different frequency bands of the signal can be used to extract information from aliased components of the superposition signal in a single pass which would otherwise not be possible to separate.

Example FIG. 1 shows an overview of an apparatus 100 (which may also be referred to as a system) including an analog to digital converter module 106 and a digital signal processor module 108. Also shown in this example embodiment is an analog front end arrangement 118 and a controller 120. The analog front end arrangement 118 and the controller 120 will be described in more detail below with respect to FIG. 2 and FIG. 5 respectively.

The ADC is configured to receive an input signal 110, which in this example is provided from the analog front end arrangement 118. The ADC is configured to sample the input signal and output a superposition signal 112 which is provided to an input of the DSP 108. In one or more examples, the superposition signal 112 may be provided to the DSP via one or more other components (not shown). However, as will be understood from the description that follows, those "other components" are not configured to filter the input signal to remove frequency content of the input signal above 0.5×Fsample before being sampled.

The DSP 108 is configured to process the superposition signal and generate a plurality of bit streams 114, 115, 116, 117 from the superposition signal. At least one of the plurality of bit streams 114, 115, 116, 117 may be generated from content in the input signal 110 that has frequencies wholly above 0.5×Fsample, as will be described further below.

The controller 120 may be configured to communicate with one or more remote devices that generate the input signal for the apparatus 100 via control signals 122, 128.

Figure 2:
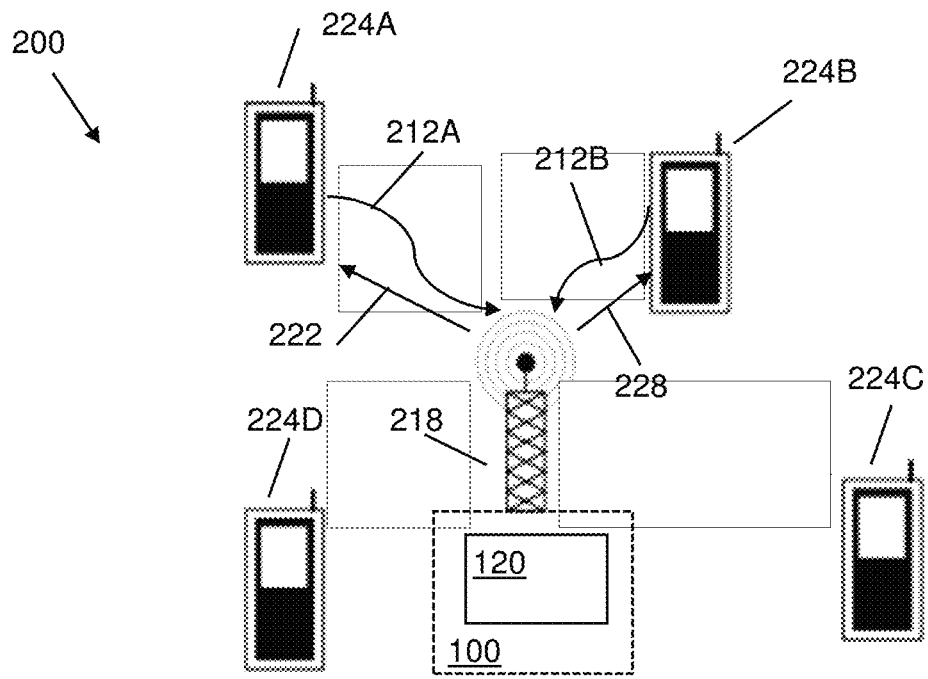
FIG. 2 shows an example of the apparatus provided within a telecommunication base station and being configured to communicate with a plurality of remote devices.

FIG. 2 shows an example arrangement in which the apparatus 100 is within a telecommunication base station 200. The base station 200 includes an antenna 218 which may be capable of transmitting control signals 222, 228 to each of a plurality of devices including at a first device 224A, a second device 224D, a third device 224C and a fourth device 224D. The devices are remote from the base station and are configured to at least transmit signals to the base station. The control signals may define a frequency band and an encoding scheme each of the plurality of devices should use when transmitting. The frequency band and/or the encoding scheme may be different for each of the plurality of devices, at least for those plurality of devices that may be configured to transmit at the same time. The controller 120 may be configured to generate said control signals 222, 228 for a first and second of the plurality of devices 224A, 224B as well as control signals intended for whichever communication devices are connected to the base station 200. The example in FIG. 2 shows four communication devices 224A to 224D, although the concepts herein are not limited to four devices. However, for ease of explanation, the input signal to the ADC 106 will be assumed to have been generated by four different devices 224A, 224B, 224C, 224D.

Figure 3:
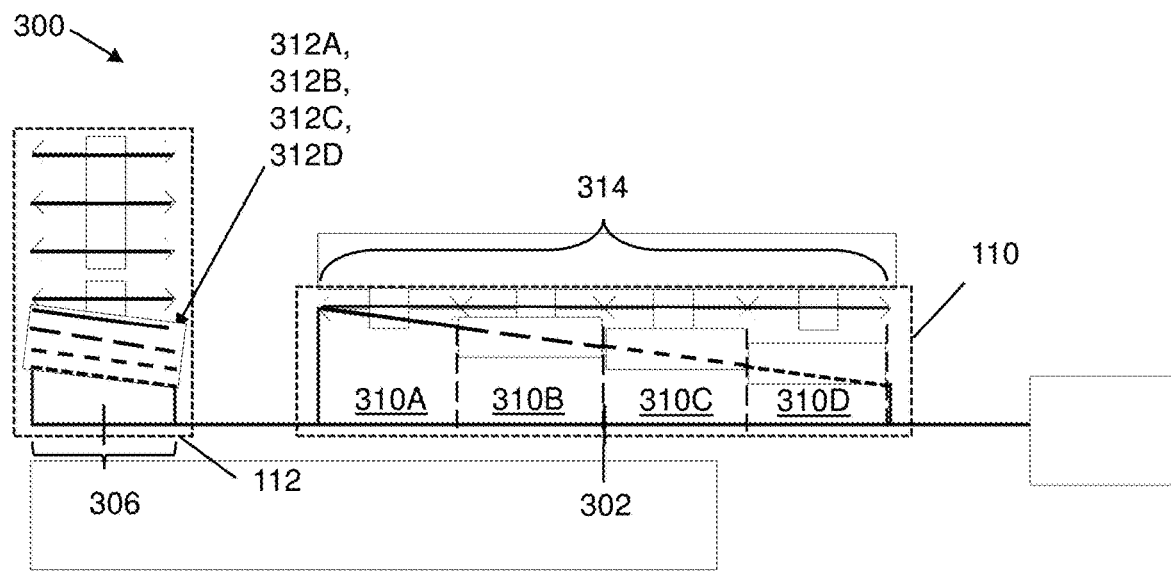
FIG. 3 shows an example representation of the operational bandwidth of the input signal and the under-sampled aliased signal output by the ADC.

FIG. 3 shows a frequency space along a horizontal axis and includes a representation of the input signal 110, which may include the input to the apparatus 100 of FIG. 1. The input signal 110 has an operational bandwidth 314 (OBW), centred about a particular carrier frequency 302. In the example of FIG. 3, the input signal 110 is centred about 100 GHz and the operational bandwidth 314 is 8 GHz. It will be appreciated that the OBW of the input signal 110 may be any given bandwidth and that the carrier frequency may also be centred about any desired carrier frequency in accordance with the requirements of the communication system and therefore the base station and devices 224A-224D being used.

With reference to FIG. 1 as well as FIG. 3, the analog front end arrangement 118 is configured to receive the input signal 110, which may have the form of the example input signal of FIG. 3. The apparatus 100 may be configured to down-convert the input signal from its carrier frequency to baseband or, alternatively, the apparatus 100 (in particular the ADC 106) may be configured to receive a baseband input signal. Thus, a down converter not part of the apparatus 100 may provide for said down conversion prior to receipt by the apparatus 100. In other examples, the input signal may be a baseband signal.

The input signal 110 that is provided to the input of the ADC 106 may include a plurality of frequency bands 310A, 310B, 310C and 310D. Thus, the input signal 110 may include a combination of signals transmitted from a plurality of different devices 224A, 224B, 224C, 224D wherein each device 224A, 224B, 224C, 224D uses a different one of the plurality of frequency bands. However, in other examples, the input signal may be transmitted from a single entity. Further, in other examples the input signal may be received from fewer devices than there are frequency bands in the input signal, such that one or more of the devices transmit using more than one frequency band.

The ADC 106, as mentioned above, is configured to provide as an output the superposition signal 112. An example of the superposition signal 112 is shown in FIG. 3 in baseband form at 112. The superposition signal can be considered to consist of a plurality of folded/aliased components 112A, 112B, 112C, 112D, corresponding to each of the frequency bands 310A, 310B, 310C, 310D of the input signal. As mentioned previously, the plurality of folded/aliased signals are generated by under-sampling the input signal 110. Each of the plurality of bit streams output by the DSP 108 may be derived from information contained wholly or in part in a corresponding one of the frequency bands 310A, 310B, 310C, 310D.

Thus, to summarize, the ADC 108 is configured to receive the input signal 110 and to output a superposition signal 112 which in the example of FIG. 3 includes an aliased signal containing information from the four different frequency bands, which will be referred to as "aliased components" of the superposition signal.

The ADC 106 is configured to under sample the input signal 110 despite the signal received by the ADC containing desired frequency content above the Nyquist frequency. Thus, the aliased components 112A, 112B, 112C and 112D are generated by under-sampling the input signal 110 using a sampling frequency, Fsample of the ADC that is below the Nyquist rate for the input signal 110.

The ADC 106 may be configured to sample the input signal at a rate twice the bandwidth of a frequency band within the input signal. Thus, for an input signal that includes a plurality of frequency bands each containing different information, wherein the frequency bands have a frequency band bandwidth, the ADC 106 is configured to sample the input signal at a rate greater than or equal to the Nyquist rate for one of the frequency bands. Accordingly, in one or more examples, the "minimum" sampling rate may include twice the frequency of the highest frequency content in one of the frequency bands (or, if the input signal is split into I and Q components, the same frequency as the highest frequency content, as will be appreciated by those skilled in the art).

Thus, with reference to the example of FIG. 3, the minimum sampling frequency may correspond to (e.g. be at least equal to or greater than) the bandwidth of each of the frequency bands 310A, 310B, 310C, 310D of the input signal. In particular, the sampling frequency may be twice the bandwidth of each of the frequency bands to meet the Nyquist criterion.

Thus, the input signal 110 has a bandwidth of 8 Ghz. The bandwidth of the baseband version of the input signal includes X, which may also include 8 Ghz. The 8 GHz bandwidth in RF translates to 4 GHz for the "real" component of the signal (I) and 4 GHz for the imaginary component of the signal (Q). Applying the Nyquist sample rate therefore requires a sampling rate of 8 GSPS for each component.

The Nyquist rate for the down-converted input signal (i.e., the baseband version of the input signal) therefore includes 2.X (wherein X is the bandwidth of the down-converted input signal). However, the ADC 106 is configured to sample at less than 2.X. For example, the ADC may be configured to sample at a sampling frequency less than 90% of 2.X or less than any of 80%, 70%, 60%, 50%, 40%, 30%. It will be appreciated that the Nyquist rate for an in-phase component or a quadrature component of the down-converted input signal may include 1.X. Accordingly, the ADC may be configured to sample at a sampling frequency less than 90% of 1.X or less than any of 80%, 70%, 60%, 50%, 40%, 30%.

The digital signal processor 108 is configured to process the superposition signal 112, 312 in the digital domain. In particular, the DSP 108 is configured to separate the single superposition signal (or single I component and single Q component) into a plurality of bit streams 114, 115, 116, 117. FIG. 1 shows four bit streams corresponding to the four frequency bands 310A, 3108, 310C, 310D. However the number of bit streams can be more than or less than this. The number of bitstreams configured to be generated may correspond to the number of aliased components within the superposition signal 112.

In one or more examples, each of the plurality of bit streams 114, 115, 116, 117 corresponds to information encoded in a different one of the plurality of frequency bands 310A, 310B, 310C, 310D of the input signal 110, 310. Each frequency band of the plurality of frequency bands may include a part, in the frequency domain, of the input signal 110. Each of the frequency bands may be considered to have a carrier frequency centred at spaced points in the frequency domain across the operational bandwidth 314. Each of the frequency bands may be encoded with a different, orthogonal encoding scheme. Thus, each frequency band may be encoded orthogonally relative to the other of the frequency bands. The carrier frequency of the frequency bands and/or their respective orthogonal encoding schemes may be predetermined by a standard. Alternatively, the control signals 122, 128 from the controller 120 may assign the frequency band and/or encoding scheme for each of the devices 224A, 224B, 224C, 224D.

The use of mutually orthogonal encoding schemes for each of the sub-carrier frequencies/frequency bands of the input signal 110, 310 enables the signal content contained within each of the frequency bands to be extracted from the aliased/folded superposition signal 112. The orthogonal encoding schemes enable the plurality of bit streams 114, 115, 116, 117 to be effectively extracted from the superposition signal 112. In one or more examples, the information contained within the superposition signal for at least one of the plurality of bit streams is present in the input signal 110 in a frequency band that is at frequencies greater than the sampling frequency Fsample of the ADC. Thus, at least one of the plurality of frequency bands may be above the Nyquist frequency.

The example superposition signal 112 of FIG. 3 has a bandwidth that is defined by the sampling frequency Fsample of the ADC 106. In the example of FIG. 3, the sampling frequency is set to 2 GHz, or 2 giga samples per second. It will be appreciated that other sampling frequencies may be used.

In the example of FIG. 3, the input signal 310 has a bandwidth 314 of 8 GHz. FIG. 3 shows the superposition signal 112 containing the information from four different frequency bands of the input signal 110, namely information derived from the frequency bands 310A, 310B, 310C, 310D. This information is shown, for understanding, as four discrete signal components 312A, 312B, 312C, 312D. Thus, the information within the input signal 310 is under-sampled and aliased or folded into the lower bandwidth superposition signal 112.

Let us consider an input signal 110, which has a given operational bandwidth (OBW) and an ADC with a specific sampling frequency (Fsample), an undersampling factor (L) can be defined. This undersampling factor can determine the maximum number of folded signals that can be present within the superposition signal. The undersampling factor can be defined as L=OBW/Fsample, which, in the example of FIG. 3 is, 8/2=4. In one or more examples, the undersampling factor may be greater than 2.

In the example of FIG. 3, each component of the superposition signal can be referred to as a frequency slice "I" or a "carrier" representing a given frequency band 310A, 310B, 310C, 310D within the operational bandwidth 314 of the input signal 110.

In one or more examples, the bandwidth of each frequency band may be no wider than the 0.5× the sampling frequency of the ADC to be able to adequately sample each frequency band within the input signal 110. This may be achieved by defining the bandwidth of each of the frequency bands to be no wider than the sampling frequency of the ADC. Alternatively the sample rate of the ADC may be selected to be greater than the Nyquist rate for the bandwidth of each frequency band. Each carrier is identifiable as I=0 . . . I=L−1, where L is the undersampling factor as described above.

The section below summarises how the input signal 110 can be processed to generate a superposition signal 112, 312:

As an example, each carrier (I) described previously can be (for example) an OFDM modulated signal itself and an example of processing these carriers is given below.

The $k^{th}$ subcarrier X(k) becomes a superposition of L carriers:

$$X(k) = \sum_{l=0}^{L} X_l(k)$$

Adding the wireless channel response H:

$$X(k) = \sum_{l=0}^{L} H_l(k) X_l(k)$$

The channel can be estimated using a Code Division Multiplexing (CDM) scheme as per currently existing 3 GPP systems. Every carrier gets an L-long code that is orthogonal between carriers (e.g. a Walsh code) that is used to modulate its pilot sequence.

The channel estimator averages all L pilots in a resource block (RB) or equivalent grouping of frequency domain carrier waves to find $H_l(k)$. Every pilot $P_l(k)$ is modulated with $G_l(k)$. The resource block defines a small slice of the frequency domain which is defined as a dozen carriers in an OFDM signal. RB is known from the 3GPP standard but most communication systems group a number of frequency domain carriers together logically to simplify processing, as is known in the art.

Assuming that each carrier implements an OFDM waveform with k subcarriers, at the apparatus 100 the signal associated with each OFDM subcarrier, across signal carrier looks like:

$$P(k) = \sum_{l=0}^{L-1} P_l(k) G_l(k) H_l(k)$$

The average power across subcarriers is:

$$P_{RB,l'}(k) = \sum_{k=0}^{L-1} P(k) G_{l'}(k) P_{l'}(k) = \sum_{l=0}^{L-1} H_l \sum_{k=0}^{L-1} G_{l'}(k) G_l(k) = H_L$$

where, $\sum_{k=0}^{L-1} G_{l'}(k) G_l(k) = 0$ when $l' \neq l$

Thus, this example shows that channel estimation can be implemented using the method of the disclosure.

Given that channel estimation can be implemented, we now consider an example of how to decode the different carriers or "aliased components". Note again that the input signal is a superposition of carriers:

$$X(k) = \sum_{l=0}^{L} X_l(k)$$

In one or more examples, the controller 120 is configured to provide for transmission of a first message 122 to the first device 224A, but could be to any of the devices communicating with the apparatus 100. Said first message may be configured to cause the first device to transmit signalling 112A, 212A, including at least a first signal at the first frequency band 310A within the operational bandwidth 314 and to use a first encoding scheme to produce said first signal. This first signal, at least in part, forms said input signal 110. The apparatus 100 may be further configured to provide for transmission of the second message 128, 228 to the second device 224B, but could be to any of the devices communicating with the apparatus 100. Said second message may be configured to cause the second device to transmit signalling 112B, 2128, including at least a second signal at the second frequency band 3108 within the operational bandwidth 314 and to use a second encoding scheme to produce said second signal. The second signal, at least in part, forms said input signal 110 with the first signal. In this example, the second signal which is encoded by the second encoding scheme is orthogonal relative to the first signal encoded by said first encoding scheme. Thus, in one or more examples, the use of orthogonal encoding schemes may allow for the information in the first signal and the second signal to be extracted from the superposition signal despite the aliasing.

It will be appreciated that the controller 120 may be configured to transmit a plurality of messages to a plurality of devices to cause each of the plurality of devices to transmit signalling on a different one of a plurality of frequency bands using a different one of a plurality of mutually orthogonal encoding schemes. It will be appreciated that each of the devices may not be fixed to using the same frequency band for all the signals it sends. The frequency band used by any one of the devices 224A, 224B, 224C, 224D may change over the course of it transmitting signalling. Likewise, it will be appreciated that each of the devices may not be fixed to using the encoding scheme for all the signals it sends. The encoding scheme used by any one of the devices 224A, 224B, 224C, 224D may change over the course of it transmitting signalling. Thus, at any one time that the input signal includes information encoded with different orthogonal codes, that information may be separable into discrete bitstreams from the undersampled, superposition signal 112.

Figure 4:
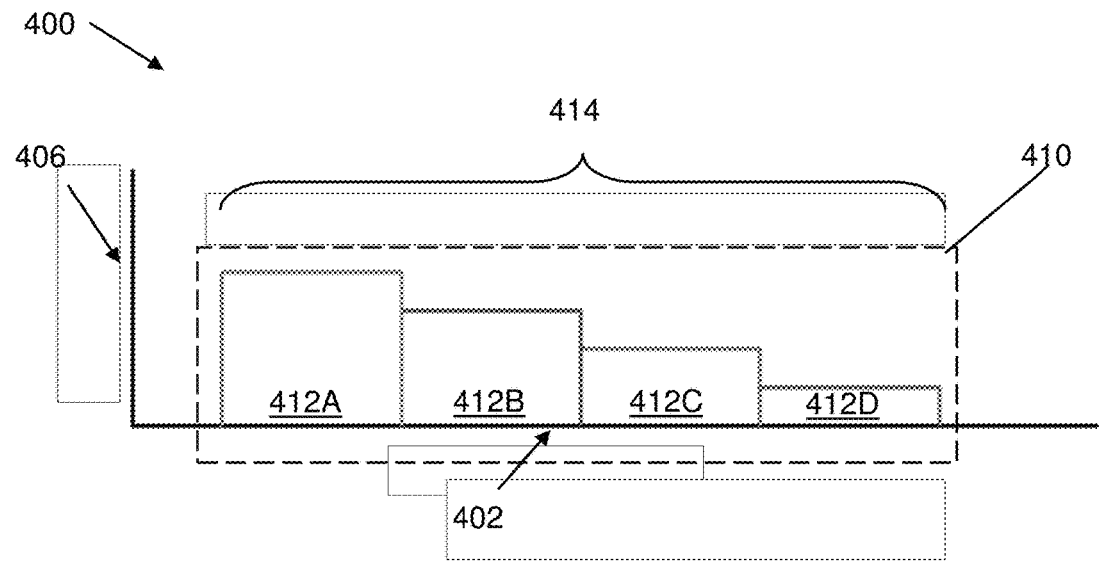
FIG. 4 shows signals from different frequency bands within the operational bandwidth that are encoded with discrete power levels to allow for separation of the information in each frequency band from the under-sampled aliased signal.

FIG. 4 shows an example embodiment which utilises a different approach to differentiate between the adjacent frequency bands 412A, 412B, 413C, 413D within the input signal 410. The input signal 410 is divided into its carriers or frequency bands 412A to 412D. Each of the carriers can be distinguished from every other carrier by utilising different power levels 406 for each carrier within the input signal 410. Thus, each power level used may be considered "orthogonal" to any other power level used in that it allows for separation of information in each of the frequency bands 412A, 412B, 412C, 412D. Each carrier 412A, 4128, 412C, 412D may be encoded using the same coding scheme or alternatively may have a combination of different power levels and a plurality of orthogonal encoding schemes for each carrier.

Thus, as shown in the examples of FIG. 3 and FIG. 4, the input signal is frequency division multiplexed. In addition, the frequency division multiplexed frequency bands are encoded with the orthogonal encoding schemes as represented in FIG. 3.

In order for the apparatus 100, 500 to be able to extract the individual carriers 312A, 312B, 312C, 312D from within the different frequency bands 310A, 310B, 310C, 310D of the input signal 310, each carrier of the different frequency bands 310A, 310B, 310C, 310D must exhibit orthogonality. This may allow the DSP to be able to differentiate between them. There are many different methods found within the field of signal processing to extract mutually orthogonal codes from within an input signal.

In one embodiment the apparatus may use a non-orthogonal multiple access (NOMA) scheme to extract the various components from within the input signal 310. In this scheme, carriers 412A, 412B, 412C and 412D are separated in power 406 as is shown in FIG. 4.

The power level difference between two adjacent carriers (PdB) is the sensitivity level required to decode the modulation scheme (eg QAM level). The process for NOMA is outlined below.

Step 1: Decode the highest power level frequency band 412A, where the frequency band 412A will experience a signal to noise ratio (SNR) of PdB, limited (mainly) by interference from the adjacent frequency band 412B.

Step 2: Re-encode frequency band 412A and subtract it from frequency band 412B to effectively remove signal 412A from the superposition.

Step 3: Continue decoding frequency band 412B as done in step 1 for carrier 412A.

The above steps are repeated for all remaining carriers.

The pre-condition for this scheme to work may be that the "last" carrier (412D in FIG. 4) needs to have a signal to noise ratio (SNR) larger or equal to P dB for successful decoding, effectively imposing an overall SNR≥L×P.

An alternative decoding technique is known in the art as spreading, this technique is briefly described below.

In this implementation, every carrier 312 is spread by a code of length L. De-spreading does the job of interference mitigation. Spreading means that each single data bit is "spread" over a longer sequence of transmitted bits. These codes, known as chip sequences, are chosen so that the data may be correctly "de-spread" at the receiver. Such codes are known as orthogonal codes. This scheme is known as CDMA (Code Division Multiple Access). CDMA balances performance (throughput) because each data bit is spread over L transmitted bits. It should be noted that both schemes (NOMA and Spreading) end up trading off SNR of the ADC against wide band performance. Both schemes can be combined to provide a balanced implementation.

Various orthogonal encoding schemes will be familiar to those skilled in the art. However, in one or more examples the orthogonal encoding schemes used may include Code Division Multiple Access (CDMA), Orthogonal Code Multiple Access (OCMA), other examples include Direct Spread Code Division Multiple Access (DS-CDMA), Frequency-Hopping CDMA (FH-CDMA) or Spatial Division Multiple Access (SDMA).

Figure 5:
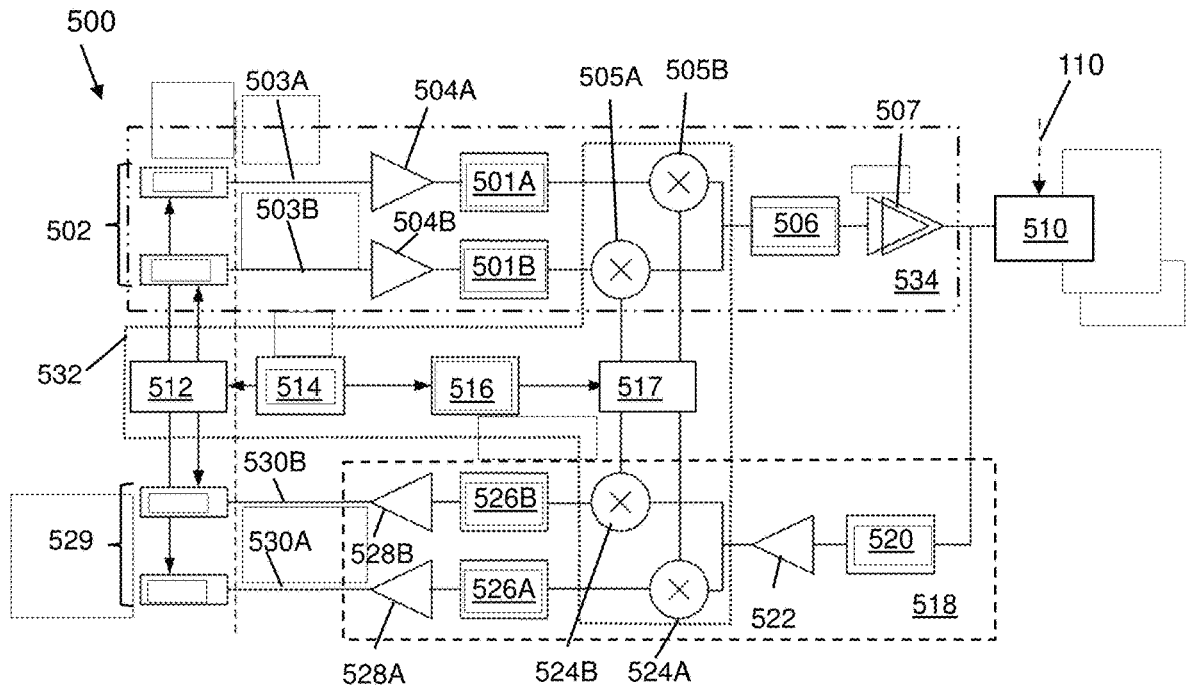
FIG. 5 shows an example embodiment of the apparatus having both a receiver and transmitter arrangement, wherein each arrangement includes a down converter, band pass filters and low pass filters, and a port to couple to an antenna.

FIG. 5 shows an example embodiment in which the apparatus 100 forms part of a transceiver arrangement 500. The analog front end arrangement 518 for a receiver configuration includes an antenna port 510 couplable to an antenna. The antenna that is coupled to the antenna port is further configured to communicate with the plurality of devices 224A, 224B, 224C, 224D and may be configured to receive the input signal over the operational bandwidth.

The analog front end arrangement 518 may further include a band pass filter 520 and an amplifier 522. The band pass filter 520 may be configured to allow the OBW 314 of the input signal 310 to pass through to the ADC 529 and may filter out all frequency content above or below the OBW. In some embodiments, the apparatus may not have a band pass filter at all and may be configured provide the entire received signal to the ADC 529 and will extract the useful information using the DSP 108.

The output from the amplifier 522 may be provided to a downconverter 532 to convert the input signal 110 to baseband. In this example, the downconverter is configured to split the input signal into in-phase and quadrature components. Thus, the downconverter is provided by mixers 524A and 524B, wherein the mixers are each coupled to a phase shifter 517. The phase shifter may introduce a 90-degree phase shift to one of the mixers 524B to split the input signal into the in-phase 530A and quadrature 530B signals. The downconverter 532 further includes a phase lock loop (PLL) 512, an oscillator 514, and a voltage controlled oscillator (VCO) 516 for providing the oscillating signal to the phase shifter 517.

In other examples, the down converter 532 may not split the input signal into in-phase and quadrature components.

The down-converted in-phase and quadrature component output signal from each of the mixers 524A and 524B may be provided to low pass filters (LPF) 526A, 526B and amplifiers 528A and 528B to generate an output signal including a respective one of the in-phase signal, I, 530A and a quadrature signal, Q, 530B. It will be appreciated that the low pass filter ensures that only the baseband frequency range is passed through to the ADC, however in one or more embodiments the LPF may not be implemented and an unfiltered version of the down-converted signal can be provided to the corresponding ADC 529. It should also be noted that in one or more embodiments a single ADC can be used if the signals are not split into an in-phase and a quadrature component. It will be appreciated that the cut-off frequency of the low pass filters 526A, 526B is not related to the sampling rate Fsample but instead to bandwidth of the signal that is to be undersampled by the ADC because it is intended to under-sample the input signal.

The arrangement 500 also shows a transmitter part 534. The transmitter part may use the phase lock loop (PLL) 512, oscillator 514, and the voltage controlled oscillator (VCO) 516 to provide the oscillating signal to the phase shifter 517 and mixers 505A, 505B to up convert a signal for transmission.

Thus, a signal for transmission may be generated as an in-phase signal and quadrature signal by DACs 502, amplified by amplifier 504A, 504B and filter arrangement 501A, 501B and provided for up-conversion by the mixers 505A, 505B. The output from the mixers 505A and 505B may be combined and provided to a band pass filter 506 and amplifier 507 before being passed to the antenna port 510.

Figure 6:
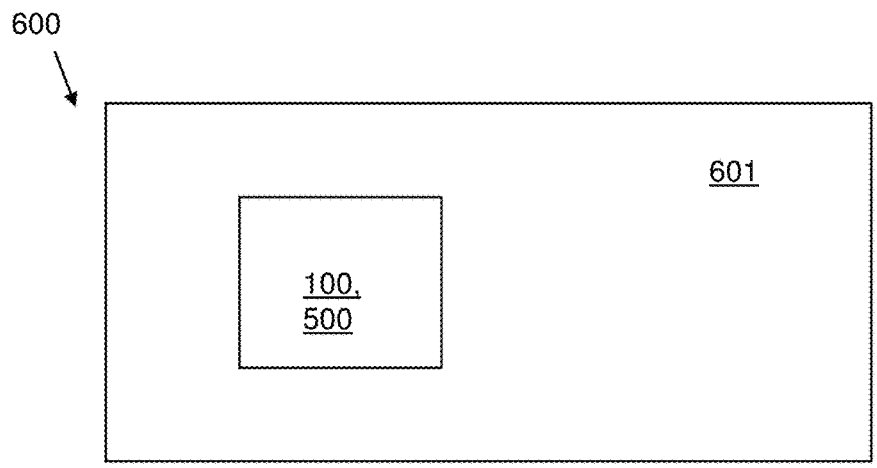
FIG. 6 shows an electronic device including the apparatus, wherein the electronic device may include a base station of a telecommunication system among other examples.

FIG. 6 shows an electronic device 600 including, for example, one of a telecommunication device 601, including the apparatus 100, 500. In one or more examples the telecommunication device may be a telecommunications base station, the device may also include a radio access point, or a RF repeater.

Figure 7:
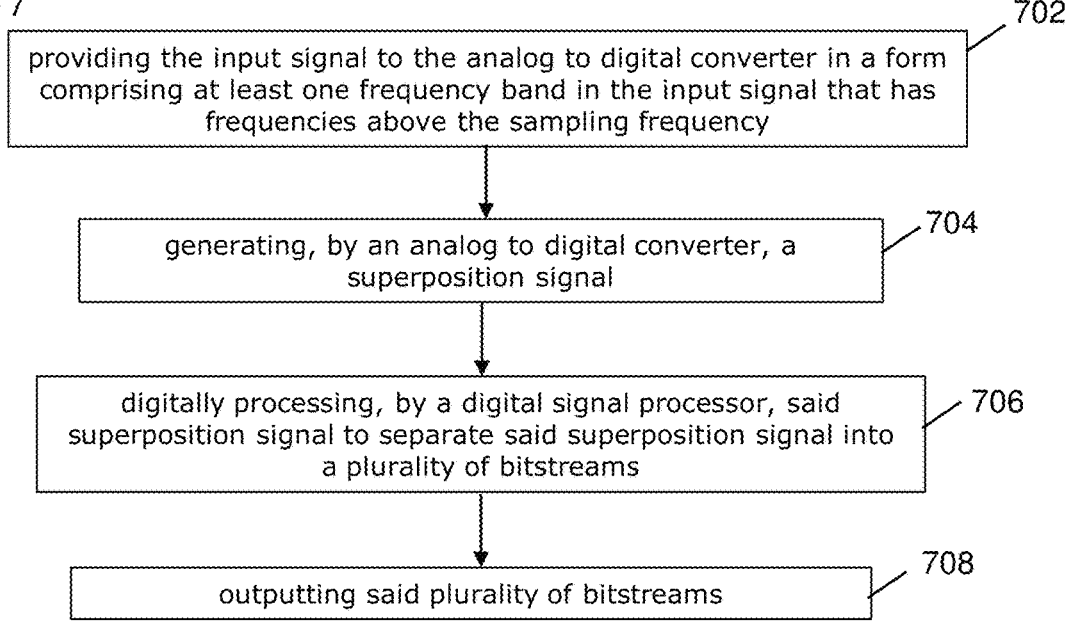
FIG. 7 shows method for generating a plurality of bitstreams from a superposition signal generated by an under-sampling ADC.

FIG. 7 outlines method 700 for processing an input signal 110. 310 using the apparatus 100, 500.

In one or more examples the method may include the following steps.

At step 702, the method includes providing the input signal to the ADC in a form including at least one frequency band in the input signal that has frequencies above the sampling frequency of the ADC. At step 704, the method includes generating, by the ADC, a superposition signal. The method further includes, at step 706, digitally processing, by a digital signal processor (DSP), said superposition signal to separate said superposition signal into a plurality of bit-streams. The method, at step 708 includes outputting said plurality of bitstreams, each corresponding the frequency bands within the input signal.

In one or more embodiments the digital signal processor 108 may be configured to separate said superposition signal 112 in the digital domain by virtue of said analog, input signal 110 including a plurality (k) of frequency bands 310A, 310B, 310C, 310D, each of bandwidth, xk, over said operational bandwidth 314, wherein the plurality of frequency bands span the entirety of the OBW 314, wherein the operational bandwidth 314 is equal to the bandwidth, xk, multiplied by the plurality of frequency bands k, and wherein said plurality of frequency bands each encoded orthogonally to one another.

Figure 8:
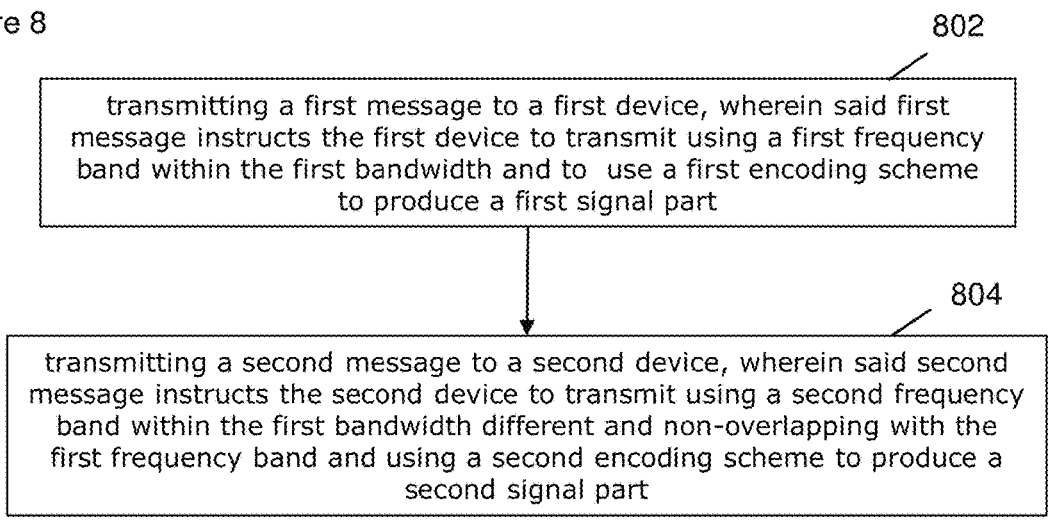
FIG. 8 shows method for controlling a plurality of devices to enable the plurality of received signals to be under-sampled and processed such that a plurality of bit streams can be generated.

FIG. 8 outlines a method 800 for controlling a plurality of devices 224 to enable the apparatus 100, 500 to extract the individual bit streams from the superposition signal 112, 312. In one or more embodiments the method further includes, at step 802, transmitting a first message to a first device, wherein said first message instructs the first device to transmit using a first frequency band within the first bandwidth and to use a first encoding scheme to produce a first signal part. The method also includes at step 804, transmitting a second message to a second device, wherein said second message instructs the second device to transmit using a second frequency band within the first bandwidth different and non-overlapping with the first frequency band and using a second encoding scheme to produce a second signal part.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture).

An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

According to a first aspect of the present disclosure there is provided an apparatus including:

an analog to digital converter (ADC) configured to generate a superposition signal, said superposition signal generated by the ADC being configured to under-sample an input signal at a sampling frequency ($F_{sample}$), said input signal that is input to the analog to digital converter has a bandwidth and said sampling frequency ($F_{sample}$) is less than a Nyquist rate for the bandwidth of the input signal;

a digital signal processor (DSP) configured to digitally processes said superposition signal to separate said superposition signal into a plurality of bitstreams, each of the plurality of bitstreams corresponding to information in a different one of a plurality of separable, distinct frequency bands within the input signal, wherein information in the superposition signal for at least one of said plurality of bitstreams is present in the input signal at frequencies greater than the sampling frequency; and wherein the digital signal processor is configured to output said plurality of bitstreams.

Thus, in one or more examples, said ADC may be configured to provide the superposition signal to the DSP including the information from the plurality of separable, distinct frequency bands aliased together by virtue of the under-sampling.

In one or more examples, the ADC may be configured to under sample the input signal in a single pass to generate the superposition signal. The ADC may be configured to under sample an input signal including N (e.g. adjacent) frequency bands, where N is at least two, using a sampling frequency less than or equal to the Nyquist rate for the bandwidth of N−1 frequency bands.

In one or more examples, the input signal includes information streams from a plurality of different devices and each of said information streams is configured to be extracted or separated to form one of the bitstreams by said processing by the DSP.

In one or more embodiments, each of the plurality of frequency bands within the input signal may be separable by virtue of one or more of:

the information therein being encoded using a mutually orthogonal encoding scheme;

the information therein being encoded using a non-orthogonal multiple access NOMA) scheme;

the information therein being encoded using Code Division Multiple Access (CDMA);

the information therein being encoded using Orthogonal Code Multiple Access (OCMA);

the information therein being encoded using Direct Spread Code Division Multiple Access (DS-CDMA), the information therein being encoded using Frequency-Hopping CDMA (FH-CDMA); and the information therein being encoded using Spatial Division Multiple Access (SDMA).

In one or more embodiments, the ADC may be configured to have a sampling frequency ($F_{sample}$) greater than the Nyquist rate for one of the plurality of separable, distinct frequency bands within the input signal.

In one or more embodiments, the apparatus may include an analog front end arrangement configured to provide the input signal to the ADC in a form such at least one of the frequency bands within the bandwidth of the input signal has frequencies wholly above the sampling frequency and wherein at least one of the plurality of bitstreams is separated from information originating in said frequency band.

Thus, in one or more examples, the information in said frequency band that is located, in the frequency domain, above the sampling frequency can be under-sampled but represented in said superposition signal by virtue of the aliasing effect and, provided the information in said frequency band is encoded orthogonally relative to any other information in the input signal, it can be separated by the digital signal processor into one of said plurality of bitstreams.

In one or more embodiments the apparatus may include:
a controller configured to:
provide for transmission of a first message to a first device, wherein said first message is configured to cause the first device to transmit signalling, including at least a first signal at a first frequency band of the plurality of distinct frequency bands within the bandwidth and to use a first encoding scheme to produce said first signal that, at least in part, forms said input signal; provide for transmission of a second message to a second device, wherein said second message is configured to cause the second device to transmit signalling, including at least a second signal at a second frequency band, different to the first frequency band, of the plurality of distinct frequency bands within the bandwidth and to use a second encoding scheme to produce said second signal that, at least in part, forms said input signal with the first signal; and
wherein (i) the second signal encoded by said second encoding scheme is orthogonal relative to the first signal encoded by said first encoding scheme or (ii) the first encoding scheme provides for use of a first signal power and the second encoding scheme provides for use of a second signal power, different to the first, in accordance with a non-orthogonal multiple access scheme (NOMA).

In one or more examples, the first frequency band and second frequency band may be non-overlapping in frequency.

In one or more embodiments, the analog front end arrangement may include:
an antenna port couplable to an antenna to receive the input signal;
a downconverter configured to down-convert the input signal to baseband and provide said baseband version of the input signal at the input of the analog to digital converter.

In one or more embodiments, the downconverter can be configured to generate a baseband in-phase input signal (I) and a baseband quadrature input signal (Q) and the apparatus includes two of said analog to digital converters wherein the input signal to a first of the analog to digital converters includes the baseband in-phase input signal and a second of the analog to digital converters includes the baseband quadrature input signal.

In one or more embodiments, the input signal may include an orthogonal frequency-division multiplexed signal.

Further, in one or more examples the digital signal processor can be configured to separate said superposition signal into a plurality of bitstreams by de-spreading the superposition signal, which includes a Code Division Multiple Access (CDMA) multiplexed signal.

In one or more embodiments, the input signal to the analog to digital converter can include a baseband signal.

In one or more embodiments, the apparatus can include a telecommunication base station.

According to a second aspect of the present disclosure there is provided a method of processing an input signal including:
generating, by an analog to digital converter, a superposition signal, said superposition signal generated by under-sampling an input signal at a first sampling frequency, wherein said input signal that is input to the analog to digital converter has a bandwidth and said sampling frequency ($F_{sample}$) is less than a Nyquist rate for the bandwidth of the input signal;
digitally processing, by a digital signal processor, said superposition signal to separate said superposition signal into a plurality of bitstreams, each of the plurality of bitstreams corresponding to information in a different one of a plurality of separable, distinct frequency bands within the input signal, wherein information in the superposition signal for at least one of said plurality of bitstreams is present in the input signal at frequencies greater than the sampling frequency; and
outputting said plurality of bitstreams.

In one or more examples, the method can include sending instructions to one or more devices that generate the input signal to provide for:
encoding of the frequency bands of the input signal using a mutually orthogonal encoding scheme, or
encoding of the frequency bands of the input signal using a non-orthogonal multiple access (NOMA) scheme,
and wherein each of the devices receiving said instructions are thereby configured to use a different orthogonal code scheme or a different signal power in accordance with NOMA for each information stream that is to be separated by said digital processing.

In one or more examples, the method may include, by the digital signal processor, separating said superposition signal in the digital domain by virtue of said analog, input signal including a plurality of frequency bands over said bandwidth, said information in the plurality of frequency bands each encoded orthogonally to one another.

In one or more embodiments, the method can include the step of providing the input signal to the analog to digital converter in a form including at least one frequency band in the input signal that has frequencies above the sampling frequency and wherein at least one of the plurality of bitstreams is separated from information originating in said frequency band.

Thus, in one or more examples the information in said frequency band that is located, in the frequency domain, above the sampling frequency can be under-sampled but represented in said superposition signal and, provided the information in said frequency band is encoded orthogonally relative to any other information in the input signal, it can be separated by the digital signal processor into one of said plurality of bitstreams.

In one or more embodiments, the method can include:
transmitting a first message to a first device, the first device configured to transmit a signal that, at least in part, forms said input signal;
transmitting a second message to a second device, the first device configured to transmit a signal that, at least in part, forms said input signal;
wherein said first message instructs the first device to transmit using a first frequency band of the plurality of distinct frequency bands within the bandwidth of the input signal and to use a first encoding scheme to produce a first signal part; and
wherein said second message instructs the second device to transmit using a second frequency band of the plurality of distinct frequency bands within the bandwidth of the input signal different and non-overlapping with the first frequency band and using a second encoding scheme to produce a second signal part, wherein (i) the second signal encoded by said second encoding scheme is orthogonal relative to the first signal encoded by said first encoding scheme or (ii) the first encoding scheme provides for use of a first signal power and the second encoding scheme provides for use of a second signal power, different to the first, in accordance with a non-orthogonal multiple access scheme (NOMA).

In one or more embodiments, the method can include:
down-converting the input signal to baseband;
providing the down-converted version of the input signal to an input of the analog to digital converter.

According to a third aspect of the present disclosure there is a system including:

an apparatus configured to receive an input signal having a bandwidth;

a first device configured to transmit a first signal including a first frequency part of said input signal, wherein the first frequency part includes a part, in the frequency domain, of the frequencies that form the input signal, wherein the first signal is configured to be transmitted with a first encoding scheme;

a second device configured to transmit a second signal including a second frequency part of said input signal, wherein the second frequency part includes a part, in the frequency domain, of the frequencies that form the input signal different to the first frequency part, wherein the second signal is configured to be transmitted with a second encoding scheme and wherein the first signal is encoded such that it is separable from the second signal and is transmitted contemporaneously;

wherein the apparatus is configured to receive the input signal formed of the first signal and the second signal and includes:

an analog to digital converter configured to generate a superposition signal, said superposition signal generated by under-sampling the input signal at a sampling frequency ($F_{sample}$) wherein said sampling frequency ($F_{sample}$) is less than a Nyquist rate for the bandwidth of the input signal;

a digital signal processor configured to digitally processes said superposition signal to separate said superposition signal into a plurality of bitstreams, each of the plurality of bitstreams corresponding, respectively, to information in each of the separable first signal and the second signal from said superposition signal, wherein information in the superposition signal for at least one of said plurality of bitstreams is present in the input signal at frequencies greater than the sampling frequency; and outputting said plurality of bitstreams.

The invention claimed is:

1. An apparatus comprising:
an analog to digital converter (ADC) configured to generate a superposition signal, said superposition signal generated by the ADC being configured to under-sample an input signal at a sampling frequency ($F_{sample}$) wherein said input signal that is input to the analog to digital converter has a bandwidth and said sampling frequency, $F_{sample}$, is less than a Nyquist rate for the bandwidth of the input signal;

a digital signal processor (DSP) configured to digitally processes said superposition signal to separate said superposition signal into a plurality of bitstreams, each of the plurality of bitstreams corresponding to information in a different one of a plurality of separable, distinct frequency bands within the input signal, wherein the information in the superposition signal for at least one of said plurality of bitstreams is present in the input signal at frequencies greater than the sampling frequency; and wherein the digital signal processor is configured to output said plurality of bitstreams.

2. The apparatus of claim 1, wherein each of the plurality of frequency bands within the input signal are separable by virtue of one or more of:

the information therein being encoded using a mutually orthogonal encoding scheme; and the information therein being encoded using a non-orthogonal multiple access (NOMA) scheme;

the information therein being encoded using Code Division Multiple Access (CDMA);

the information therein being encoded using Orthogonal Code Multiple Access (OCMA);

the information therein being encoded using Direct Spread Code Division Multiple Access (DS-CDMA);

the information therein being encoded using Frequency-Hopping CDMA (FH-CDMA); and the information therein being encoded using Spatial Division Multiple Access (SDMA).

3. The apparatus of claim 1, wherein the sampling frequency ($F_{sample}$) is greater than the Nyquist rate for the different one of the plurality of separable, distinct frequency bands within the input signal.

4. The apparatus of claim 1, wherein the apparatus comprises an analog front end arrangement configured to provide the input signal to the ADC in a form such at least one of the frequency bands within the bandwidth of the input signal has frequencies wholly above the sampling frequency and wherein at least one of the plurality of bitstreams is separated from information originating in said frequency band.

5. The apparatus of claim 1, wherein said apparatus comprises:

a controller configured to:

provide for transmission of a first message to a first device, wherein said first message is configured to cause the first device to transmit signalling, comprising at least a first signal at a first frequency band of the plurality of distinct frequency bands within the bandwidth and to use a first encoding scheme to produce said first signal that, at least in part, forms said input signal;

provide for transmission of a second message to a second device, wherein said second message is configured to cause the second device to transmit signalling, comprising at least a second signal at a second frequency band, different to the first frequency band, of the plurality of distinct frequency bands within the bandwidth and to use a second encoding scheme to produce said second signal that, at least in part, forms said input signal with the first signal; and wherein (i) the second signal encoded by said second encoding scheme is orthogonal relative to the first signal encoded by said first encoding scheme or (ii) the first encoding scheme provides for use of a first signal power and the second encoding scheme provides for use of a second signal power, different to the first, in accordance with a non-orthogonal multiple access scheme (NOMA).

6. The apparatus of claim 4, wherein the analog front end arrangement comprises:
an antenna port couplable to an antenna to receive the input signal;
a downconverter configured to down-convert the input signal to baseband and provide said baseband version of the input signal at the input of the analog to digital converter.

7. The apparatus of claim 6, wherein the downconverter is configured to generate a baseband in-phase input signal (I) and a baseband quadrature input signal (Q) and the apparatus includes two of said analog to digital converters wherein the input signal to a first of the analog to digital converters comprises the baseband in-phase input signal and the input signal to a second of the analog to digital converters comprises the baseband quadrature input signal.

8. The apparatus of claim 1, wherein the input signal comprises an orthogonal frequency-division multiplexed signal.

9. The apparatus of claim 1, wherein the input signal to the analog to digital converter comprises a baseband signal.

10. The apparatus of claim 1, wherein the apparatus comprises a telecommunication base station.

11. The apparatus of claim 1, wherein the ADC is configured to provide the superposition signal to the DSP comprising the information from the plurality of separable, distinct frequency bands aliased together by virtue of the under-sampling.

12. The apparatus of claim 1, wherein the ADC is configured to under-sample the input signal in a single pass to generate the superposition signal.

13. The apparatus of claim 5, wherein the first frequency band and second frequency band are non-overlapping in frequency.

14. The apparatus of claim 1, wherein the digital signal processor is configured to separate said superposition signal into a plurality of bitstreams by de-spreading the superposition signal, which comprises a Code Division Multiple Access multiplexed signal.

15. A method of processing an input signal comprising;
generating, by an analog to digital converter, a superposition signal, said superposition signal generated by under-sampling an input signal at a first sampling frequency, wherein said input signal that is input to the analog to digital converter has a bandwidth and said sampling frequency ($F_{sample}$) is less than a Nyquist rate for the bandwidth of the input signal;
digitally processing, by a digital signal processor, said superposition signal to separate said superposition signal into a plurality of bitstreams, each of the plurality of bitstreams corresponding to information in a different one of a plurality of separable, distinct frequency bands within the input signal, wherein the information in the superposition signal for at least one of said plurality of bitstreams is present in the input signal at frequencies greater than the sampling frequency; and
outputting said plurality of bitstreams.

16. The method of claim 15, wherein the method includes providing the input signal to the analog to digital converter in a form comprising at least one frequency band in the input signal that has frequencies above the sampling frequency and wherein at least one of the plurality of bitstreams is separated from information originating in said frequency band.

17. The method of claim 15, wherein said method includes:
transmitting a first message to a first device, the first device configured to transmit a signal that, at least in part, forms said input signal;
transmitting a second message to a second device, the first device configured to transmit a signal that, at least in part, forms said input signal;
wherein said first message instructs the first device to transmit using a first frequency band of the plurality of distinct frequency bands within the bandwidth of the input signal and to use a first encoding scheme to produce a first signal part; and
wherein said second message instructs the second device to transmit using a second frequency band of the plurality of distinct frequency bands within the bandwidth of the input signal different and non-overlapping with the first frequency band and using a second encoding scheme to produce a second signal part,
wherein (i) the second signal encoded by said second encoding scheme is orthogonal relative to the first signal encoded by said first encoding scheme or (ii) the first encoding scheme provides for use of a first signal power and the second encoding scheme provides for use of a second signal power, different to the first, in accordance with a non-orthogonal multiple access scheme (NOMA).

18. The method of claim 17, wherein said method includes:
down-converting the input signal to baseband;
providing the down-converted version of the input signal to an input of the analog to digital converter.

19. The method of claim 15, wherein said method further includes by the digital signal processor, separating said superposition signal in the digital domain by virtue of said analog, input signal comprising a plurality of frequency bands over said bandwidth, said information in the plurality of frequency bands each encoded orthogonally to one another.

20. A system comprising:
an apparatus configured to receive an input signal having a bandwidth;
a first device configured to transmit a first signal comprising a first frequency part of said input signal, wherein the first frequency part comprises a part, in the frequency domain, of the frequencies that form the input signal, wherein the first signal is configured to be transmitted with a first encoding scheme;
a second device configured to transmit a second signal comprising a second frequency part of said input signal, wherein the second frequency part comprises a part, in the frequency domain, of the frequencies that form the input signal different to the first frequency part, wherein the second signal is configured to be transmitted with a second encoding scheme and wherein the first signal is encoded such that it is separable from the second signal and is transmitted contemporaneously;
wherein the apparatus is configured to receive the input signal formed of the first signal and the second signal and comprises:
an analog to digital converter configured to generate a superposition signal, said superposition signal generated by under-sampling the input signal at a sampling frequency ($F_{sample}$) wherein said sampling frequency ($F_{sample}$) is less than a Nyquist rate for the bandwidth of the input signal;

a digital signal processor configured to digitally processes said superposition signal to separate said superposition signal into a plurality of bitstreams, each of the plurality of bitstreams corresponding, respectively, to information in each of the separable first signal and the second signal from said superposition signal, wherein the information in the superposition signal for at least one of said plurality of bitstreams is present in the input signal at frequencies greater than the sampling frequency; and outputting said plurality of bitstreams.

* * * * *